United States Patent
Min et al.

(10) Patent No.: US 8,124,489 B2
(45) Date of Patent: Feb. 28, 2012

(54) MONOLITHIC MICROWAVE INTEGRATED CIRCUIT DEVICE AND METHOD OF FORMING THE SAME

(75) Inventors: Byoung-Gue Min, Daejeon (KR); Jongmin Lee, Daejeon (KR); Seong-Il Kim, Daejeon (KR); Hyung Sup Yoon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/832,432

(22) Filed: Jul. 8, 2010

(65) Prior Publication Data
US 2011/0140175 A1 Jun. 16, 2011

(30) Foreign Application Priority Data
Dec. 11, 2009 (KR) .................. 10-2009-0123338

(51) Int. Cl.
*H01L 21/331* (2006.01)
(52) U.S. Cl. ............... 438/314; 438/312; 257/E21.372; 257/E21.608; 257/E27.019
(58) Field of Classification Search .................. 438/314; 257/E21.372, E21.608, E27.019
See application file for complete search history.

(56) References Cited

U.S. PATENT DOCUMENTS

| 5,422,501 A | 6/1995 | Bayraktaroglu |
| 5,684,308 A * | 11/1997 | Lovejoy et al. ............... 257/184 |
| 5,712,504 A * | 1/1998 | Yano et al. .................... 257/452 |
| 6,727,530 B1 | 4/2004 | Feng et al. |
| 2002/0195620 A1* | 12/2002 | Tanomura et al. ............. 257/197 |
| 2005/0133820 A1* | 6/2005 | Min et al. ....................... 257/197 |

FOREIGN PATENT DOCUMENTS

| EP | 0710984 A1 | 5/1996 |
| JP | 2003-007840 A | 1/2003 |
| KR | 10-0171649 | 10/1998 |

* cited by examiner

*Primary Examiner* — Michael Lebentritt
*Assistant Examiner* — Daniel Whalen
(74) *Attorney, Agent, or Firm* — Rabin & Berdo, P.C.

(57) ABSTRACT

Provided are a monolithic microwave integrated circuit device and a method for forming the same. The method includes: forming an sub-collector layer, a collector layer, a base layer, an emitter layer, and an emitter cap layer on a Heterojunction Bipolar Transistor (HBT) region and a PIN diode region of a substrate; forming an emitter pattern and an emitter cap pattern in the HBT region and exposing the base layer by patterning the emitter layer and the emitter cap layer; and forming an intrinsic region by doping a portion of the collector layer of the PIN diode region with a first type impurity, the PIN diode region being spaced apart from the HBT region.

16 Claims, 18 Drawing Sheets

MONOLITHIC MICROWAVE INTEGRATED CIRCUIT DEVICE AND METHOD OF FORMING THE SAME

CROSS-REFERENCE TO RELATED APPLICATIONS

This U.S. non-provisional patent application claims priority under 35 U.S.C. §119 of Korean Patent Application No. 10-2009-0123338, filed on Dec. 11, 2009, the entire contents of which are hereby incorporated by reference.

BACKGROUND OF THE INVENTION

The present invention disclosed herein relates to a monolithic microwave integrated circuit device and more particularly to, a monolithic microwave integrated circuit device including a hetrojunction bipolar transistor (HBT) and a method for forming the same.

Due to the development of wireless communication service, a portable wireless communication device has been extensively used. A wireless communication device requires a power amplifier of various frequencies and outputs, which includes a mobile phone for voice and video communication, a smart phone with a wireless communication function such as Wi-Fi or Bluetooth besides a mobile phone feature, and a Portable Media Player (PMP) or a notebook computer with a wireless communication function.

A bipolar transistor may be used as an ultrahigh frequency semiconductor device in an ultrahigh-speed broadband communication network. Recently, researches for realizing a faster ultrahigh-speed operation by reducing a parasite component of the above device have been being made. Especially, the HBT may be used as a basic device of a power transistor and a power amplifier. For manufacturing a value-added integrated circuit, a Monolithic Microwave Integrated Circuit (MMIC) technology is used, where passive devices such as a capacitor, a resistor, an inductor in addition to the HBT (i.e., an active device) are integrated into the same chip.

Due to the development of various forms of wireless communication technologies, a wireless terminal needs to support various wireless communication standards. When a power amplifier fit for each wireless communication function is used, a high frequency switch is required to distribute input signals of diverse frequencies into each power amplifier.

SUMMARY OF THE INVENTION

The present invention provides a method for stably forming a Heterojunction Bipolar Transistor (HBT) and a PIN diode in a monolithic microwave integrated circuit device.

Embodiments of the present invention provide methods for forming a monolithic microwave integrated circuit device, the methods including: forming a sub-collector layer, a collector layer, a base layer, an emitter layer, and an emitter cap layer on a HBT region and a PIN diode region of a substrate; forming an emitter pattern and an emitter cap pattern in the HBT region and exposing the base layer by patterning the emitter layer and the emitter cap layer; and forming an intrinsic region by doping a portion of the collector layer of the PIN diode region with a first type impurity, the PIN diode region being spaced apart from the HBT region.

In some embodiments, the collector layer may be a second type compound semiconductor.

In other embodiments, the doping of the PIN diode region with the first type impurity may include: forming a mask pattern on the exposed base layer; implanting the first type impurity on the collector layer using the mask pattern as a mask; and removing the mask pattern.

In still other embodiments, a maximum ion implantation region of the first type impurity may be in the collector layer.

In even other embodiments, a concentration of the ion implantation of the first type impurity may have the same level as a second type impurity concentration of the collector layer.

In yet other embodiments, the methods may further include: forming a base pattern and a collector pattern in the HBT region and forming a first type pattern and an intrinsic pattern in the PIN diode region, by patterning the base layer and the collector layer; and forming a sub-collector pattern in the HBT region and forming a second type pattern in the PIN diode region, by patterning the sub-collector layer.

In further embodiments, the first type may be a p-type and the second type may be an n-type.

In still further embodiments, the first type impurity may be Be or C.

In even further embodiments, the methods may further include: implanting a first type impurity on a portion of the sub-collector layer.

In yet further embodiments, a concentration of the first type impurity implanted on the sub-collector layer may have the same level as a second type impurity concentration of the sub-collector layer.

In yet further embodiments, the second type pattern of the PIN diode region may be formed being broader than widths of the first type pattern and the intrinsic pattern.

In yet further embodiments, the methods may further include: forming electrodes of the HBT and the PIN diode.

In yet further embodiments, the forming of the electrodes may include forming a base electrode and an electrode of the first type pattern simultaneously on the base layer.

In yet further embodiments, the forming of the electrodes may include forming a collector electrode and an electrode of a second type pattern simultaneously on the sub-collector layer.

In yet further embodiments, the forming of the electrodes may include forming an emitter electrode, a base electrode, a collector electrode, an electrode of a first type pattern, and an electrode of a second type pattern simultaneously.

In yet further embodiments, the forming of the electrode may be performed using a lift off process.

In other embodiments of the present invention, monolithic microwave integrated circuit devices include: a HBT provided on a substrate; and a PIN diode spaced apart from the HBT and including a second type pattern, an intrinsic pattern, and a first type pattern, which are sequentially stacked on the substrate, wherein the intrinsic pattern includes a second type impurity and a first type impurity.

In some embodiments, the HBT may include an emitter cap pattern, an emitter pattern, a base pattern, a collector pattern, and a sub-collector pattern; and the collector pattern is a second type compound semiconductor.

In other embodiments, the first type may be a p-type and the second type may be an n-type.

In still other embodiments, further comprising an emitter electrode, a base electrode, a collector electrode, an electrode of the first type pattern, and an electrode of the second type pattern, wherein the base electrode and the electrode of the first type pattern are the same material, and the collector electrode and the electrode of the second type pattern are the same material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
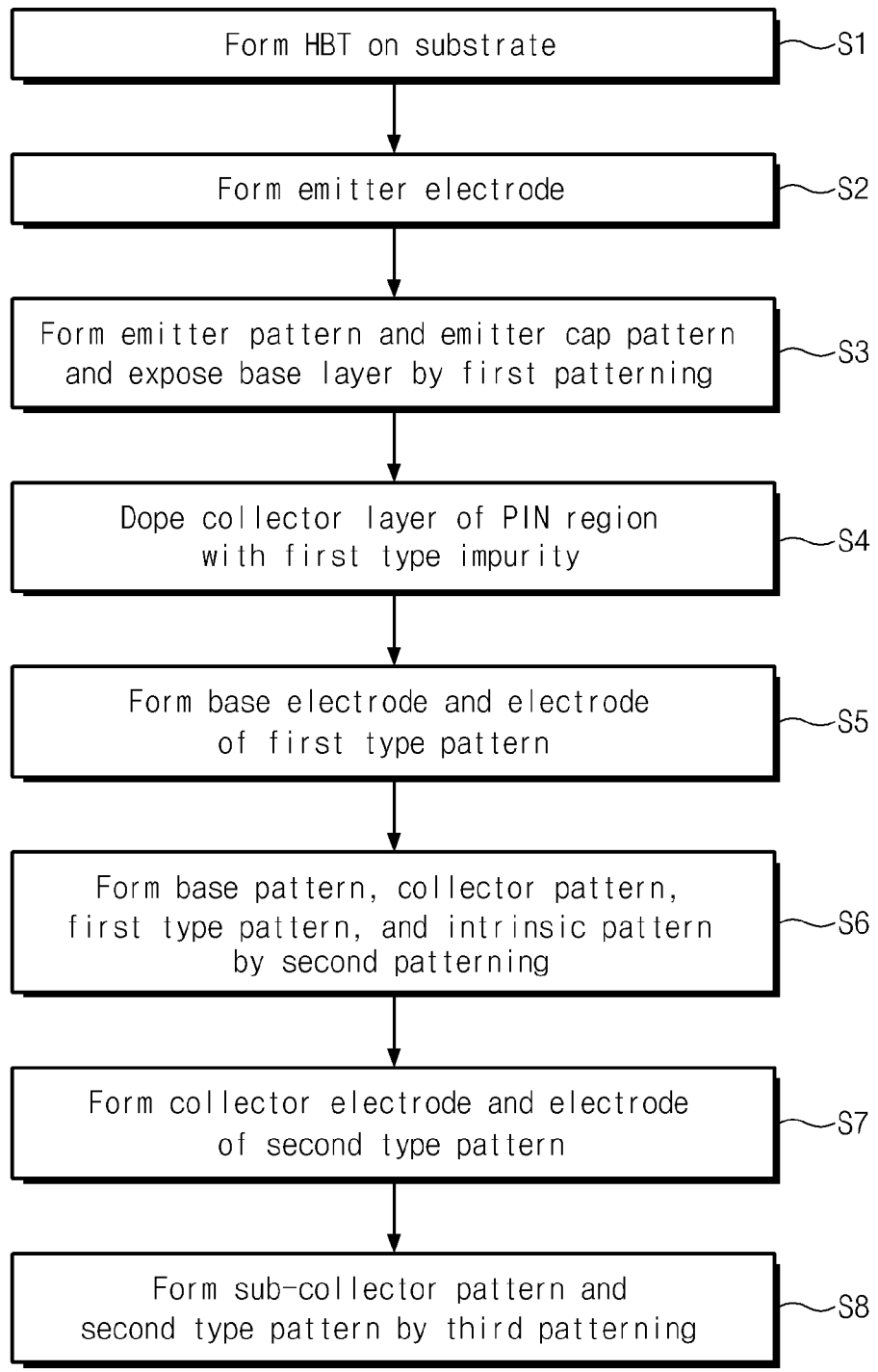
FIG. 1 is a manufacturing flowchart illustrating a method for forming a monolithic microwave integrated circuit device according to the first embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the specification, when it is mentioned that a certain material layer such as a conductive layer, a semiconductor layer, or an insulation layer is disposed "on" another material or a substrate, the certain material layer may be directly formed on the another material layer or the substrate, or another material layer may be interposed therebetween. In various embodiments of the present invention, although terms such as a first, a second, and a third are used to describe a specific operation, this just distinguishes a specific operation from other operations, but the present invention is not limited to those terms.

In the following description, the technical terms are used only for explaining a specific exemplary embodiment while not limiting the present invention. The terms of a singular form may include plural forms unless referred to the contrary. The meaning of 'comprises' and/or 'comprising' specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

FIGS. 1 through 9 are views illustrating a monolithic microwave integrated circuit device and a method for forming the same according to a first embodiment of the present invention. FIG. 1 is a manufacturing flowchart illustrating a method for forming a monolithic microwave integrated circuit device according to a first embodiment of the present invention. FIGS. 2 through 9 are sectional views illustrating a monolithic microwave integrated circuit device and a method for forming the same according to the first embodiment of the present invention.

Figure 2:
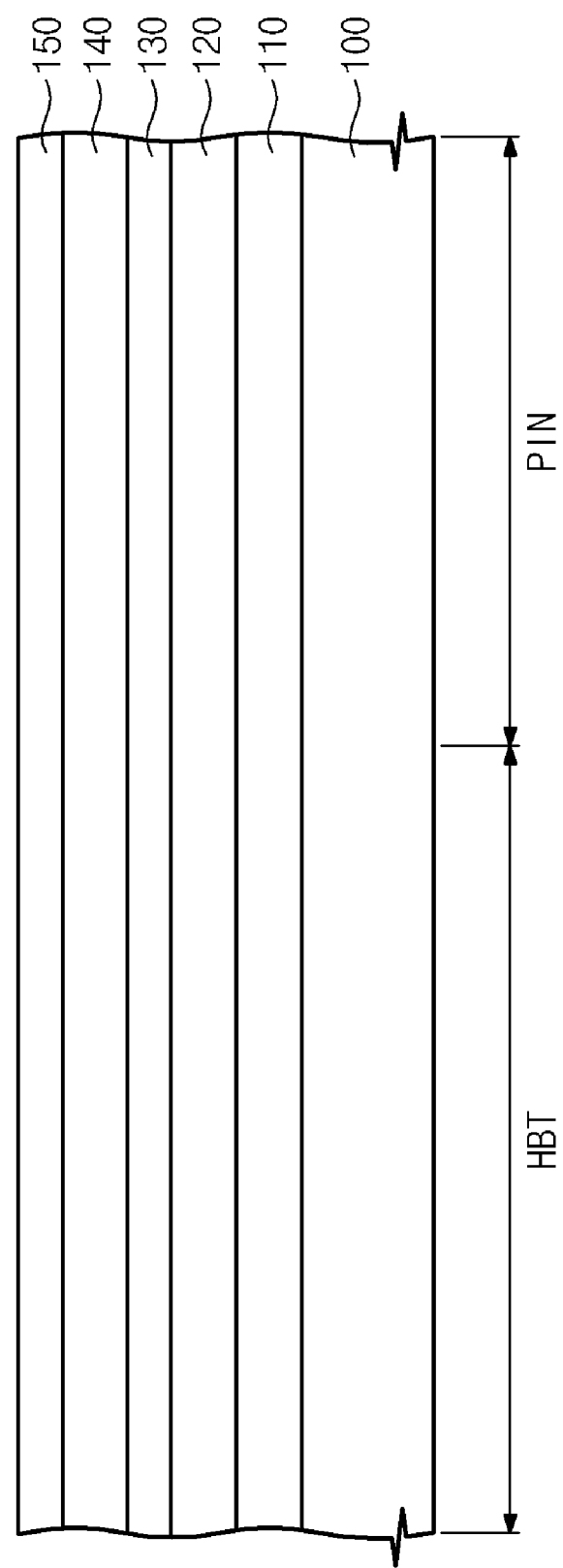
FIGS. 2 through 9 are sectional views illustrating a monolithic microwave integrated circuit device and a method for forming the same according to the first embodiment of the present invention.

Referring to FIGS. 1 and 2, layers constituting a Hetrojunction Bipolar Transistor (HBT) are formed on a substrate 100 in operation S1. The substrate 100 may include a HBT region and a PIN diode region. The substrate 100 may be a semi-insulating compound semiconductor substrate. For one example, the substrate 100 may be a GaAs or InP substrate. A sub-collector layer 110, a collector layer 120, a base layer 130, an emitter layer 140, and an emitter cap layer 150 may be formed on the substrate 100. The layers 110 to 150 may be an epitaxial layer. The layers 110 to 150 may be formed of a combination of a compound semiconductor including Group III-V elements such as GaAs, InP, InGaAs, InAlAs, InGaP, and AlGaAs to realize the HBT with respect to the substrate 100. For example, if the substrate 100 is formed of GaAs, the n+ sub-collector layer 110, the n collector layer 120, the p+ base layer 130 may be formed using GaAs, the n AlGaAs emitter layer 140, and the n+ InGaAs emitter cap layer 150 may be formed. The collector layer 120 has a thickness of about 850 nm, and a doping concentration may be about $1 \times 10^{16}$ cm$^{-3}$ to about $1 \times 10^{17}$ cm$^{-3}$. The layers 110 to 150 may be formed using Molecular Beam Epitaxy (MBE) or Metal Organic Chemical Vapor Deposition (MOCVD).

Figure 3:
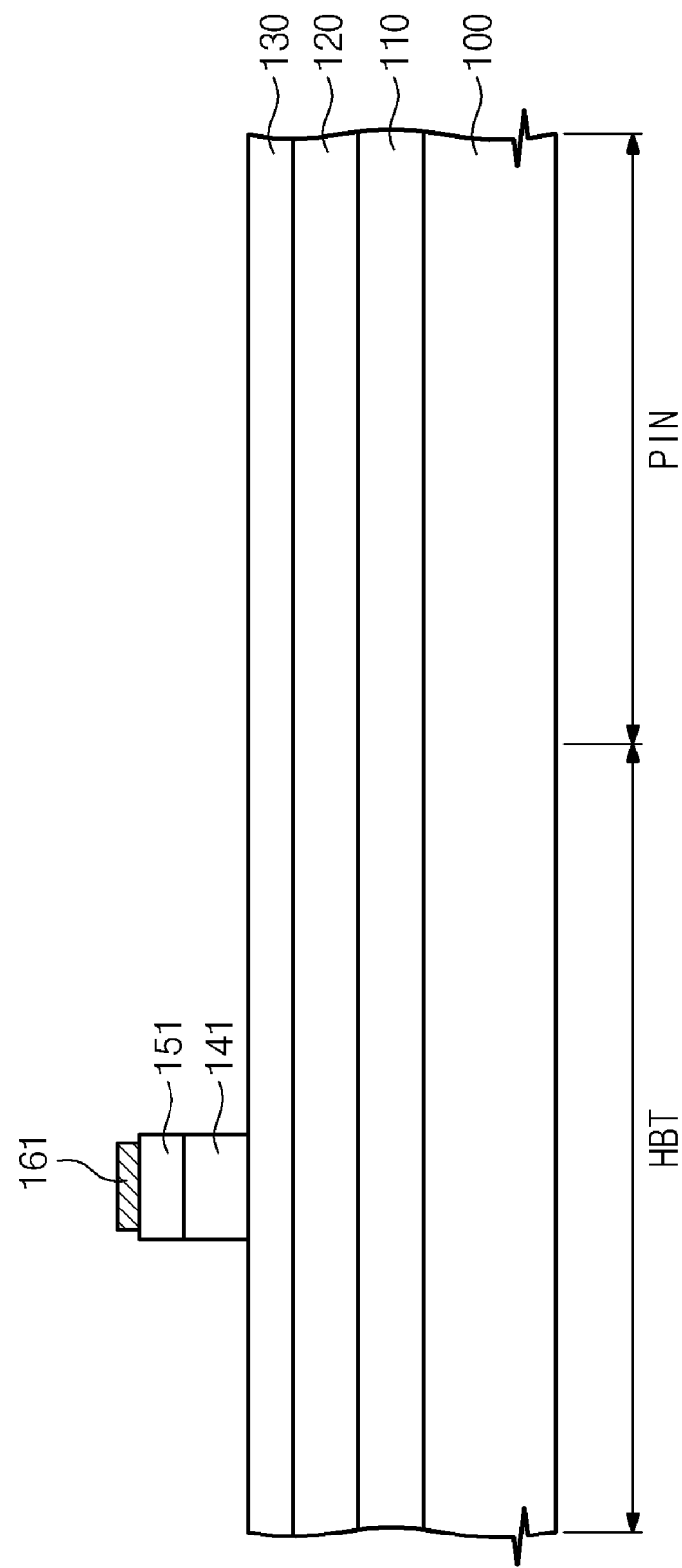

Referring to FIGS. 1 and 3, the emitter electrode 161 may be formed in operation S2. The emitter electrode 161 may be formed using a lift off process. That is, a stencil pattern (not shown) is formed on the HBT to expose a portion where an electrode is formed, and then a metal layer (not shown) is deposited on the HBT. The metal layer on the stencil pattern may be removed together when the stencil pattern is removed. The emitter electrode 161 may include at least one of Ti, Pt, and Au.

The emitter cap pattern 151 and the emitter pattern 141 are formed using a first patterning process and the base layer 130 may be exposed in operation S3. The first patterning process may be a photolithography process. The first patterning process may be performed by Reactive Ion Etching (RIE) or Inductive Coupled Plasma (ICP) using $BCl_3$, $Cl_2$, $CH_4$, $CHF_3$, $CCl_4$, or $SF_6$. The second patterning process may be wet etching using a solution such as $H_3PO_4$, HCl, $NH_4OH$ or $H_2O_2$.

Figure 4:
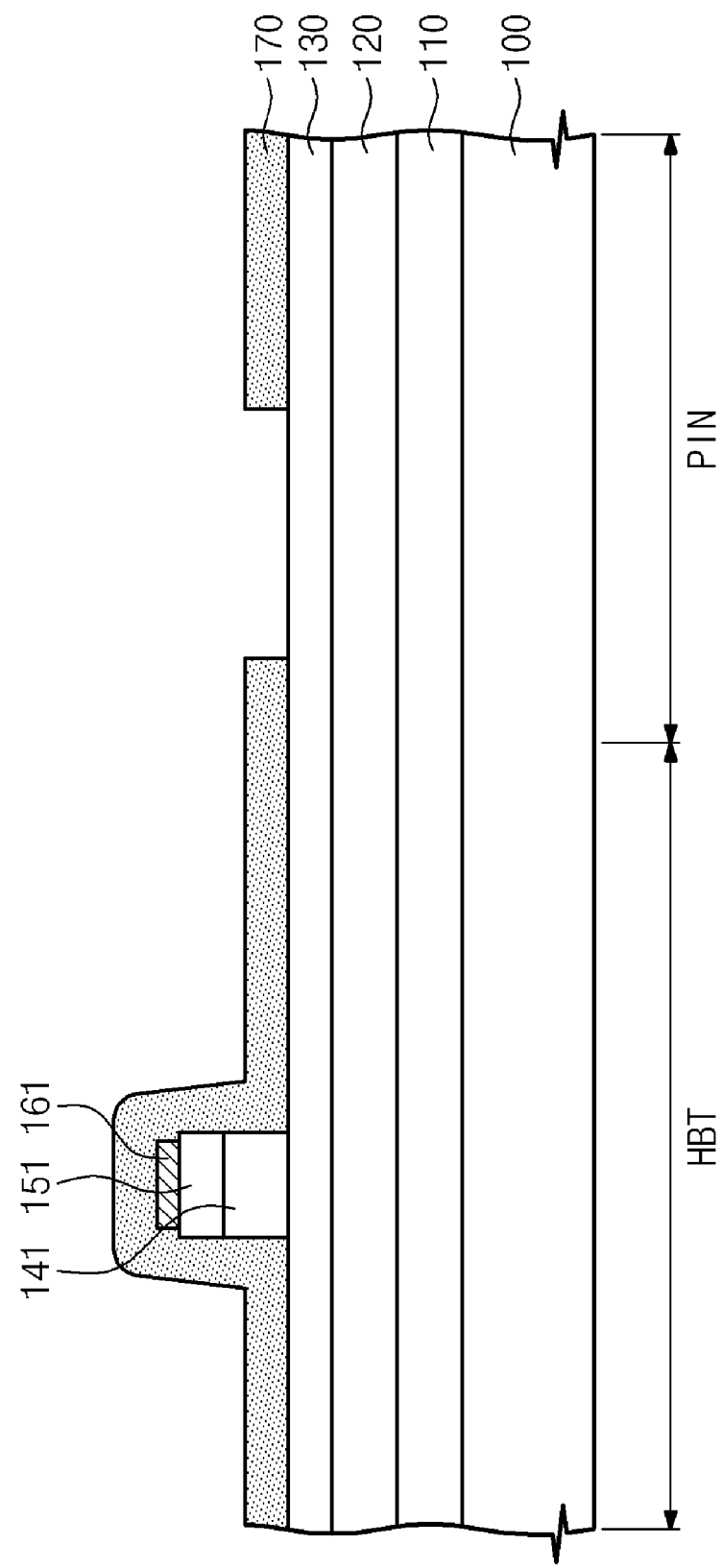

Referring to FIG. 4, a mask pattern 170 may be formed on the emitter cap pattern 151 and the exposed base layer 130. The mask pattern 170 may be a silicon oxide layer, a silicon nitride layer, or a silicon oxynitride layer. The mask pattern 170 may expose a portion of the PIN diode region. The mask pattern 170 may be formed by Plasma Enhanced CVD (PECVD) using $SiH_4$ and $NH_3$ as a reaction gas. The mask pattern 170 may be a polymer or metal layer.

Figure 5:
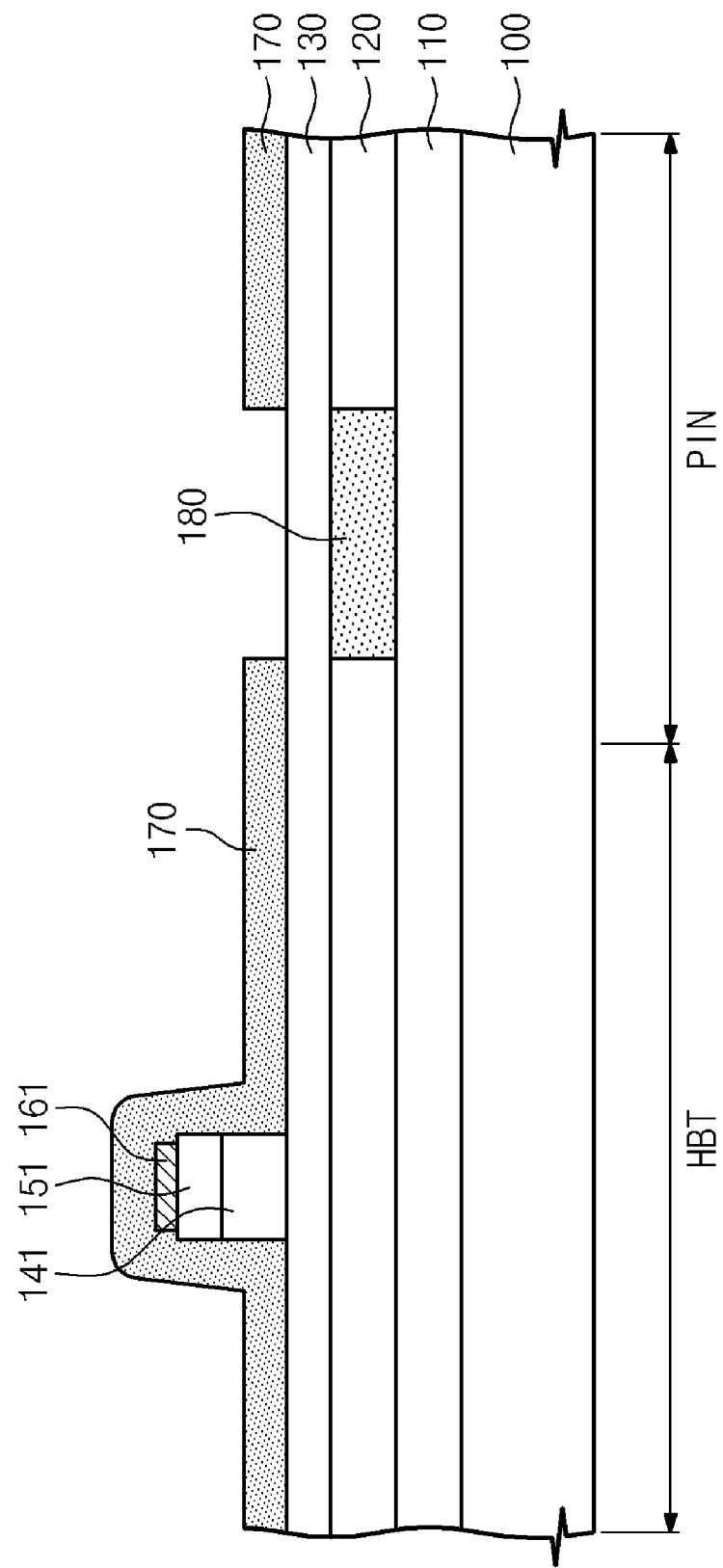

Referring to FIGS. 1 and 5, a first type impurity may be doped on the collector layer 20 of the PIN diode region in operation S4. The collector layer 120 may be a second type compound semiconductor. The first type impurity may be a p-type impurity. The second type may be an n-type impurity. That is, the doping of the collector layer 20 with the first type impurity may use an impurity that is opposite to the conductive type of the collector layer 120. In this specification, although expressions such as a p-type or an n-type are used to refer to a conductive type, the p-type or the n-type may be interchangeable. An intrinsic region 180 is formed using the doping process. The intrinsic region 180 may be formed by an ion implantation process using the mask pattern 170 as a mask. The ion implantation concentration may have the same level as the second type impurity concentration of the second type collector layer 120. The maximum ion implantation region of the first type impurity may be in the collector layer 120. The second type collector layer 120 may have an intrinsic characteristic due to the doping process. After the doping process, annealing may be additionally performed. The annealing may be Rapid Thermal Annealing (RTA). For one example, the annealing may be performed for tens of seconds below about 350° C. to about 400° C. After the doping process is finished, the mask pattern 170 may be removed.

Figure 6:
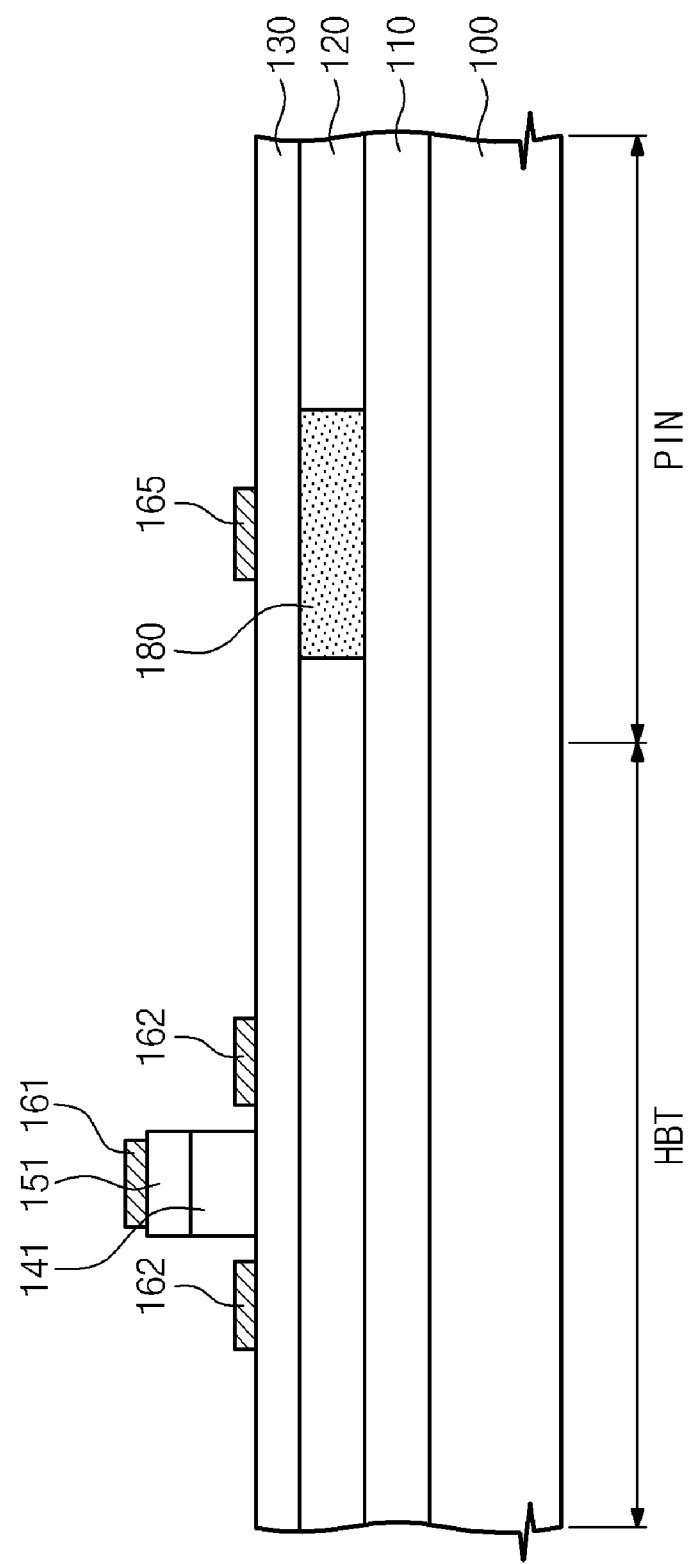

Referring to FIGS. 1 and 6, a base electrode 162 and an electrode of the first type pattern 165 are formed on the base layer 130 simultaneously in operation S5. The electrode of the first type pattern 165 may be an ohmic electrode of the first type pattern of a PIN diode, which will be described below. The electrode forming process may be performed using a lift off process. The base electrode 162 and the electrode of the first type pattern 165 may include at least one of Pt, Ti, and Au.

Figure 7:
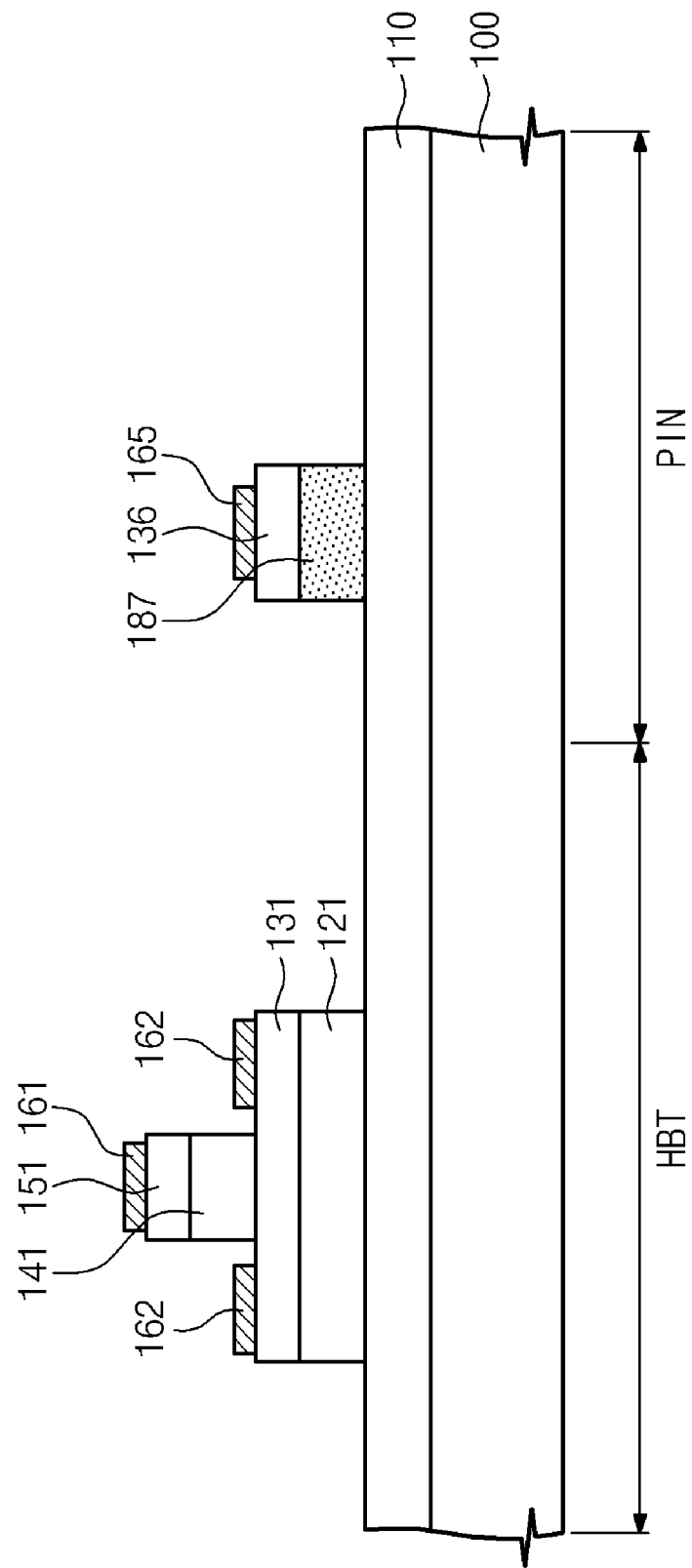
Figure 8:
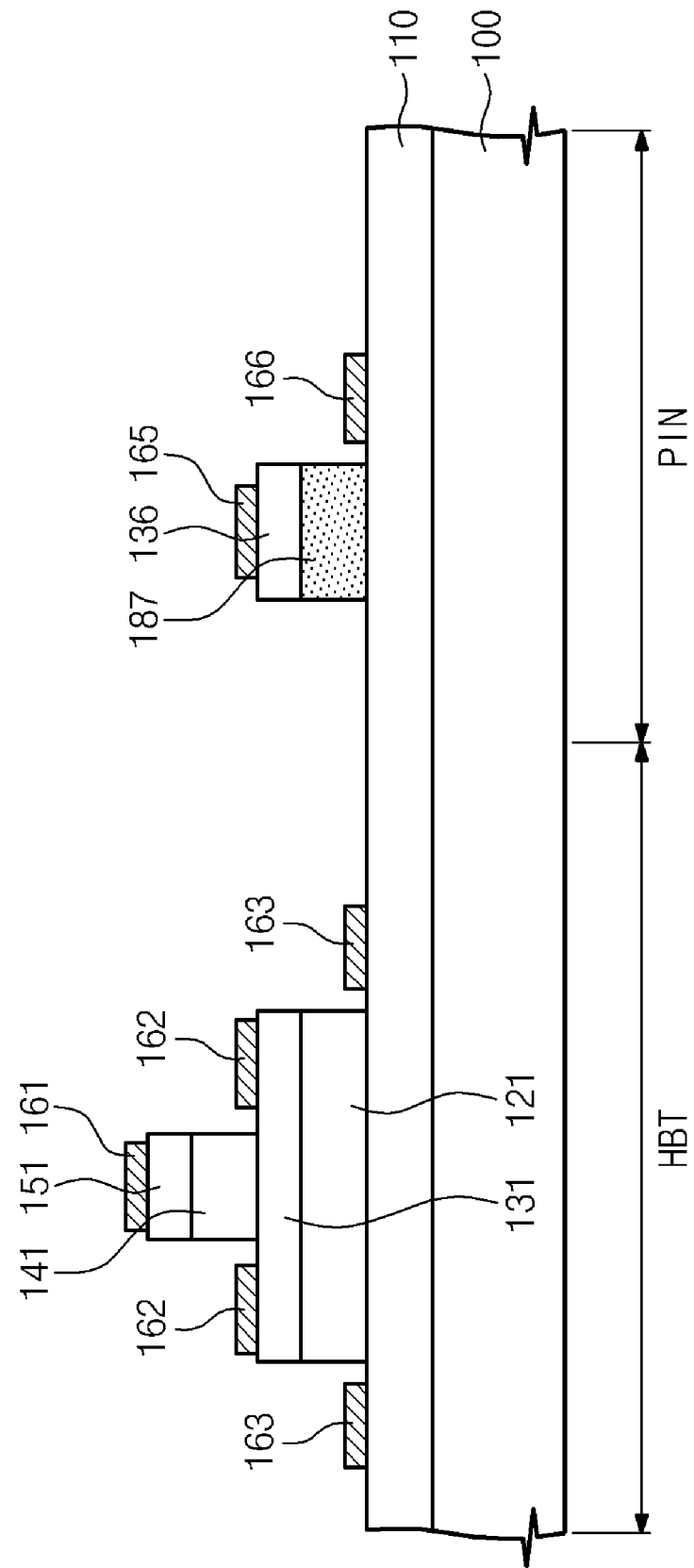

Referring to FIGS. 1 and 7, a base pattern 131, a collector pattern 121, a first type pattern 136, and an intrinsic pattern 187 may be formed using a second pattern process in operation S6. The second patterning process may be performed using the same method as the first patterning process. The intrinsic pattern 187 may include at least a portion of the intrinsic region 180. Referring to FIGS. 1 and 8, a collector electrode 163 and an electrode of the second type pattern 166 may be formed in operation S7. The forming of the collector electrode 163 and the forming of the electrode of the second type pattern 166 may be simultaneously performed using a lift off process. The collector electrode 163 and the electrode of the second type pattern 166 may include at least one of Ni, Au, and AuGe.

Figure 9:
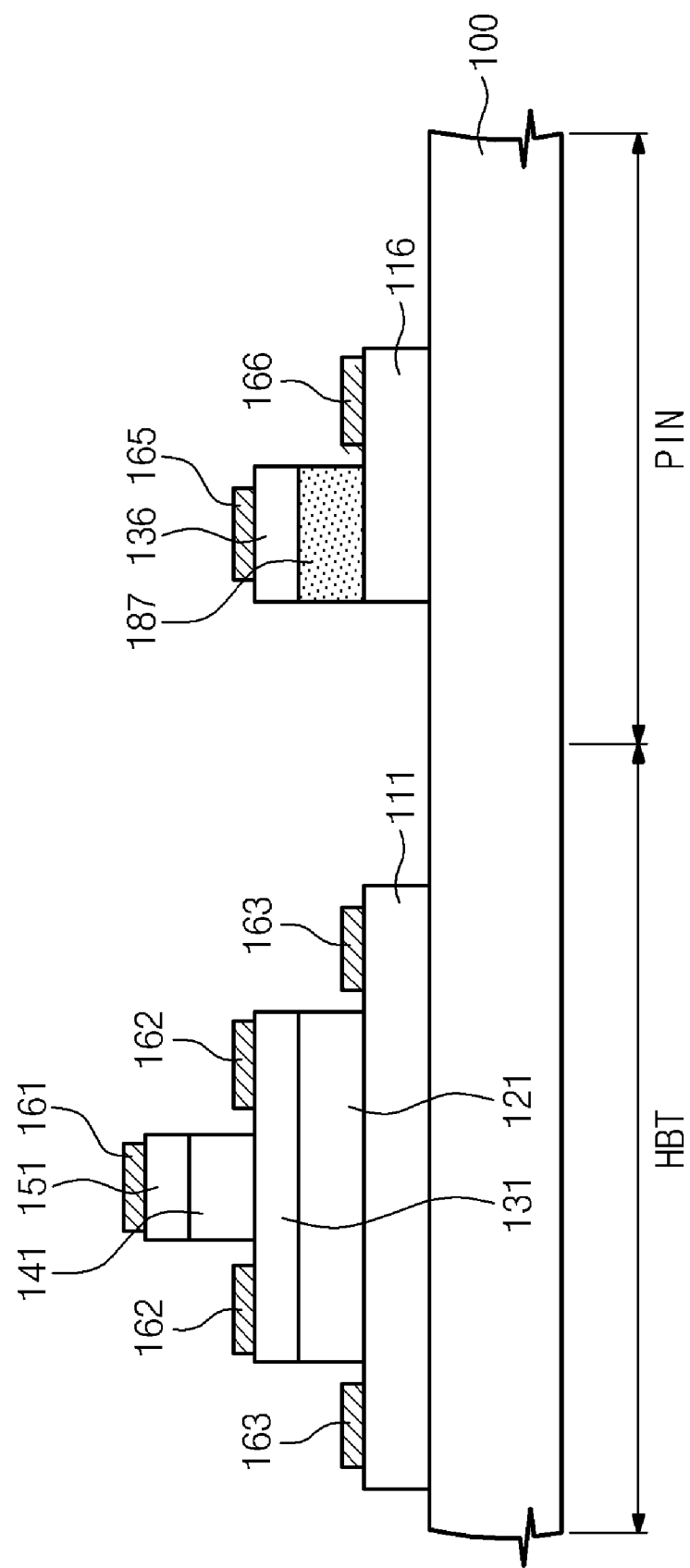

Referring to FIGS. 1 and 9, the sub-collector pattern 111 and the second type pattern 116 may be formed using a third patterning process in operation S8. The width of the second type pattern 116 may be formed being broader than the first type pattern 165 and the intrinsic pattern 187. The third patterning process may be performed using the same method as the first patterning process. The forming of the HBT and PIN diodes can be completed using the third patterning process. The PIN diode may operate as a high frequency switch. Since the PIN diode is formed together with the HBT, processes can be simplified. The PIN diode may have an excellent characteristic at a high frequency region due to a high carrier mobility of the intrinsic pattern 187.

FIGS. 10 through 18 are views illustrating a monolithic microwave integrated circuit device and a method for forming the same according to a second embodiment of the present invention. Except for differences of a doping region and an electrode forming method, this second embodiment is similar to the above mentioned first embodiment. Accordingly, for conciseness of description, description related to overlapping technical features will be omitted.

Figure 10:
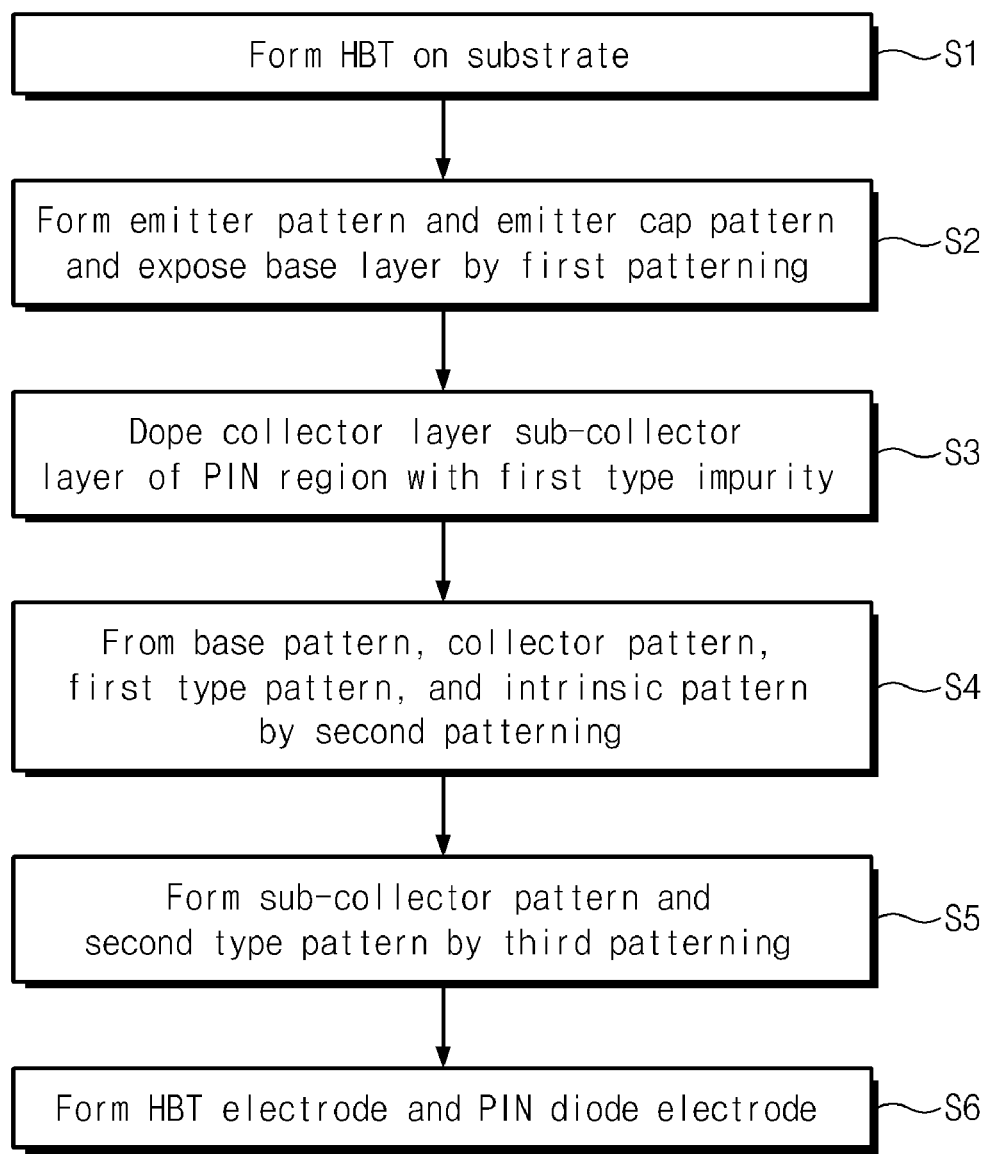
FIG. 10 is a manufacturing flowchart illustrating a method for forming a monolithic microwave integrated circuit device according to the second embodiment of the present invention.

FIG. 10 is a manufacturing flowchart illustrating a method for forming a monolithic microwave integrated circuit device according to the second embodiment of the present invention. FIGS. 11 through 18 are sectional views illustrating a monolithic microwave integrated circuit device and a method for forming the same according to the second embodiment of the present invention.

Figure 11:
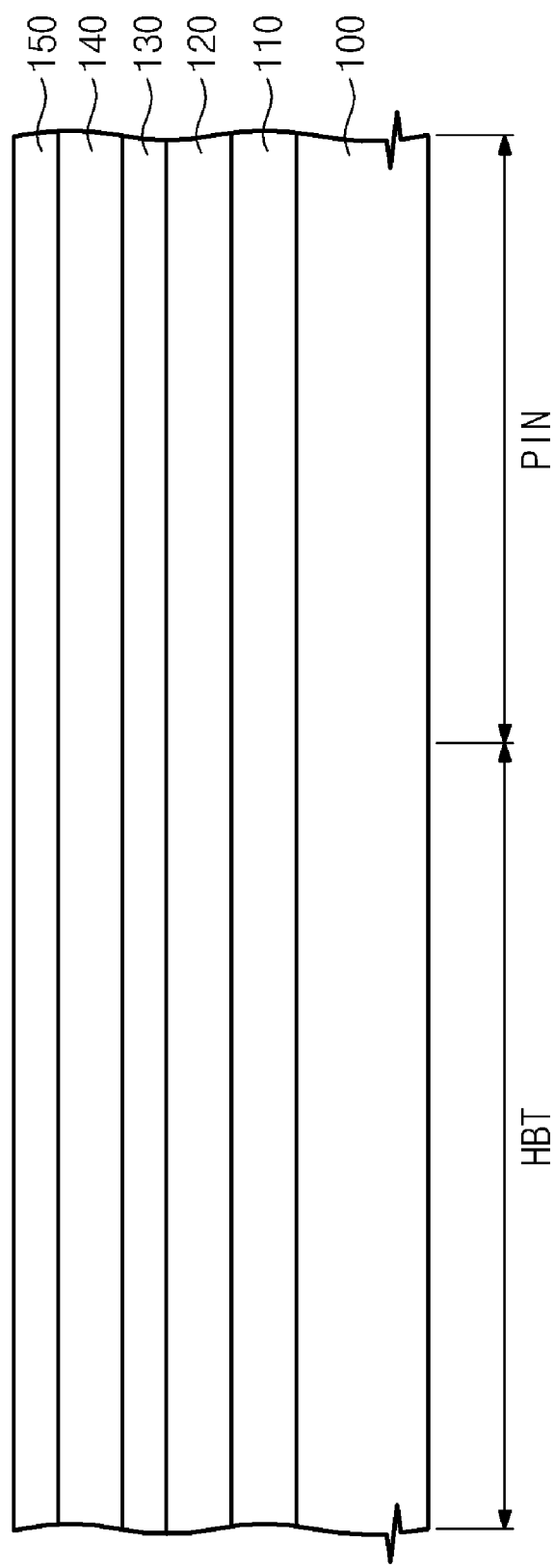
FIGS. 11 through 18 are sectional views illustrating a monolithic microwave integrated circuit device and a method for forming the same according to the second embodiment of the present invention.

Referring to FIGS. 10 and 11, layers constituting a HBT are formed on a substrate 100 in operation S1. The substrate 100 may include a HBT region and a PIN diode region. The substrate 100 may be a semi-insulating compound semiconductor substrate. For one example, the substrate 100 may be a GaAs or InP substrate. A sub-collector layer 110, a collector layer 120, a base layer 130, an emitter layer 140, and an emitter cap layer 150 may be formed on the substrate 100.

Figure 12:
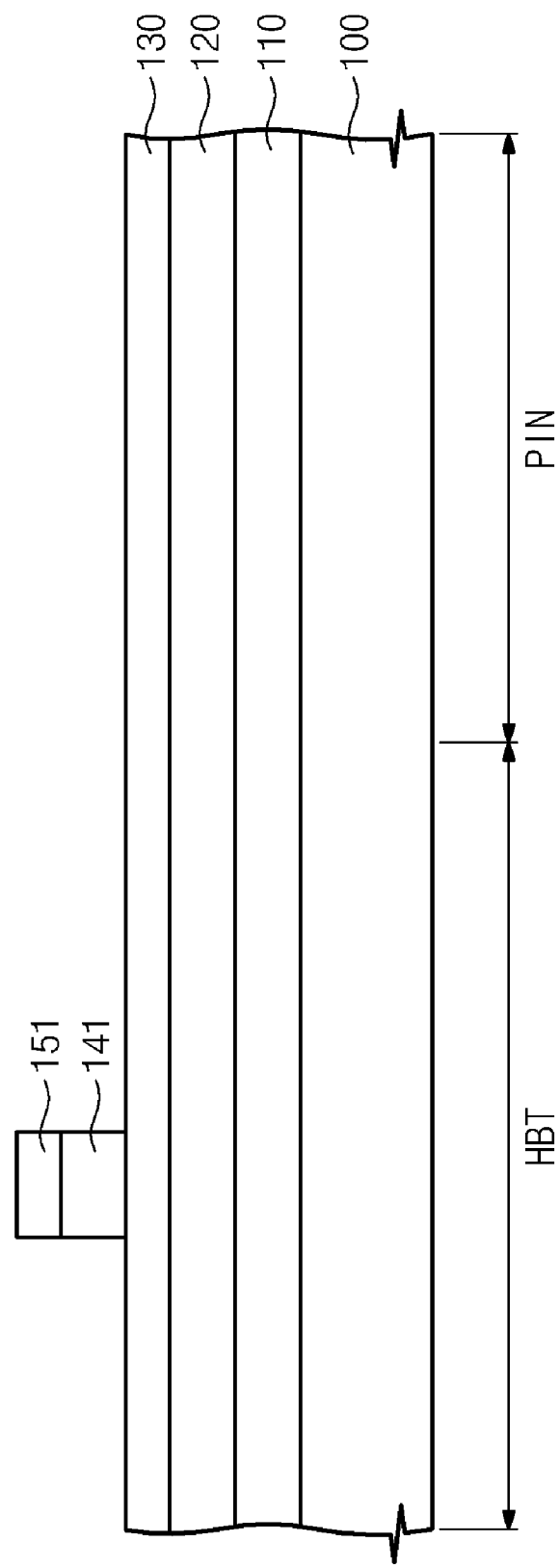

Referring to FIGS. 10 and 12, the emitter cap pattern 151 and the emitter pattern 141 are formed using a first patterning process and the base layer 130 may be exposed in operation S2. The first patterning process may be a photolithography process. The first patterning process may be performed by RIE or ICP using a reaction gas such as $BCl_3$, $Cl_2$, $CH_4$, $CHF_3$, $CCl_4$, or $SF_6$. The second patterning process may be wet etching using a solution such as $H_3PO_4$, HCl, $NH_4OH$ or $H_2O_2$.

Figure 13:
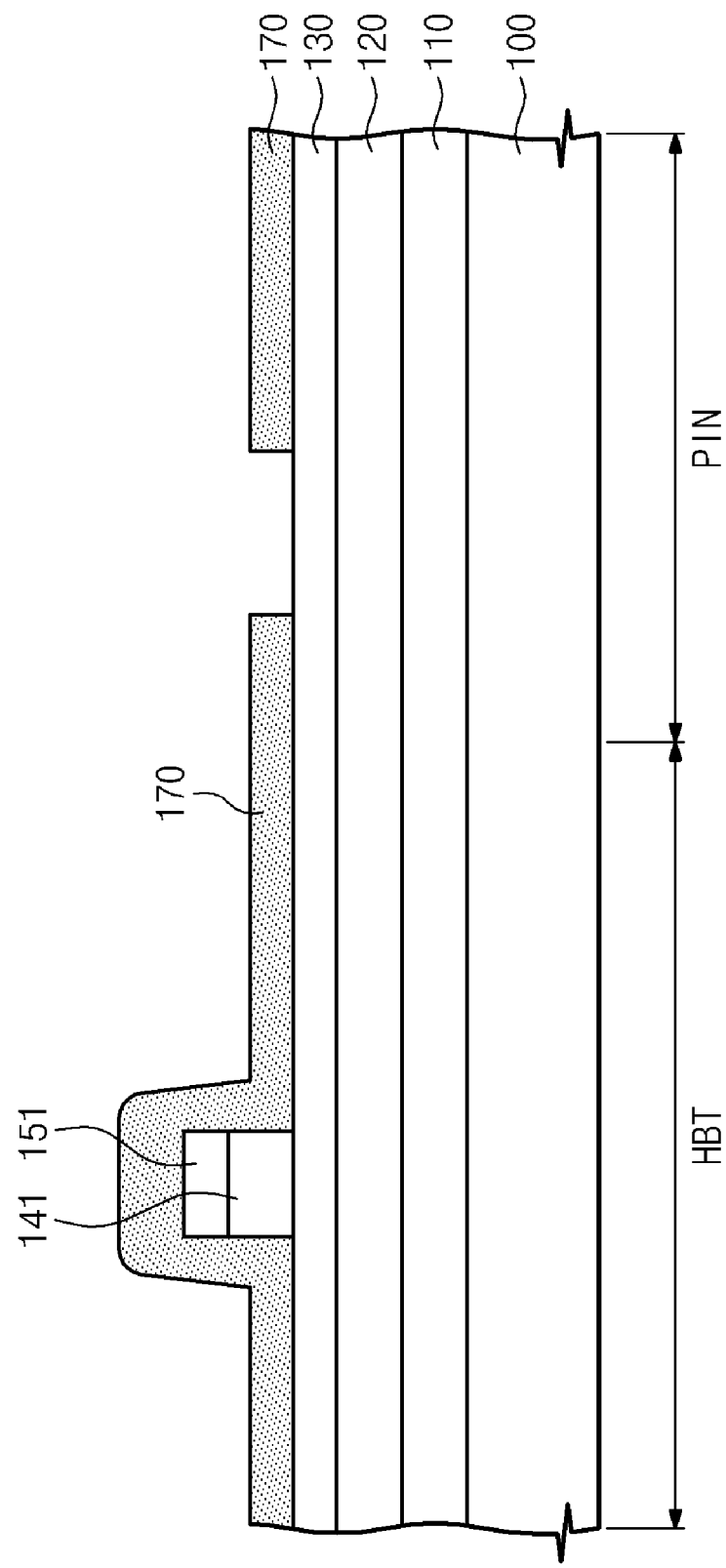

Referring to FIG. 13, a mask pattern 170 may be formed on the exposed base layer 130. The mask pattern 170 may be a silicon oxide layer, a silicon nitride layer, or a silicon oxynitride layer. The mask pattern 170 may expose a portion of the PIN diode region. The mask pattern 170 may be formed by PECVD using $SiH_4$ and $NH_3$ as a reaction gas. The mask pattern 170 may be a polymer or metal layer.

Figure 14:
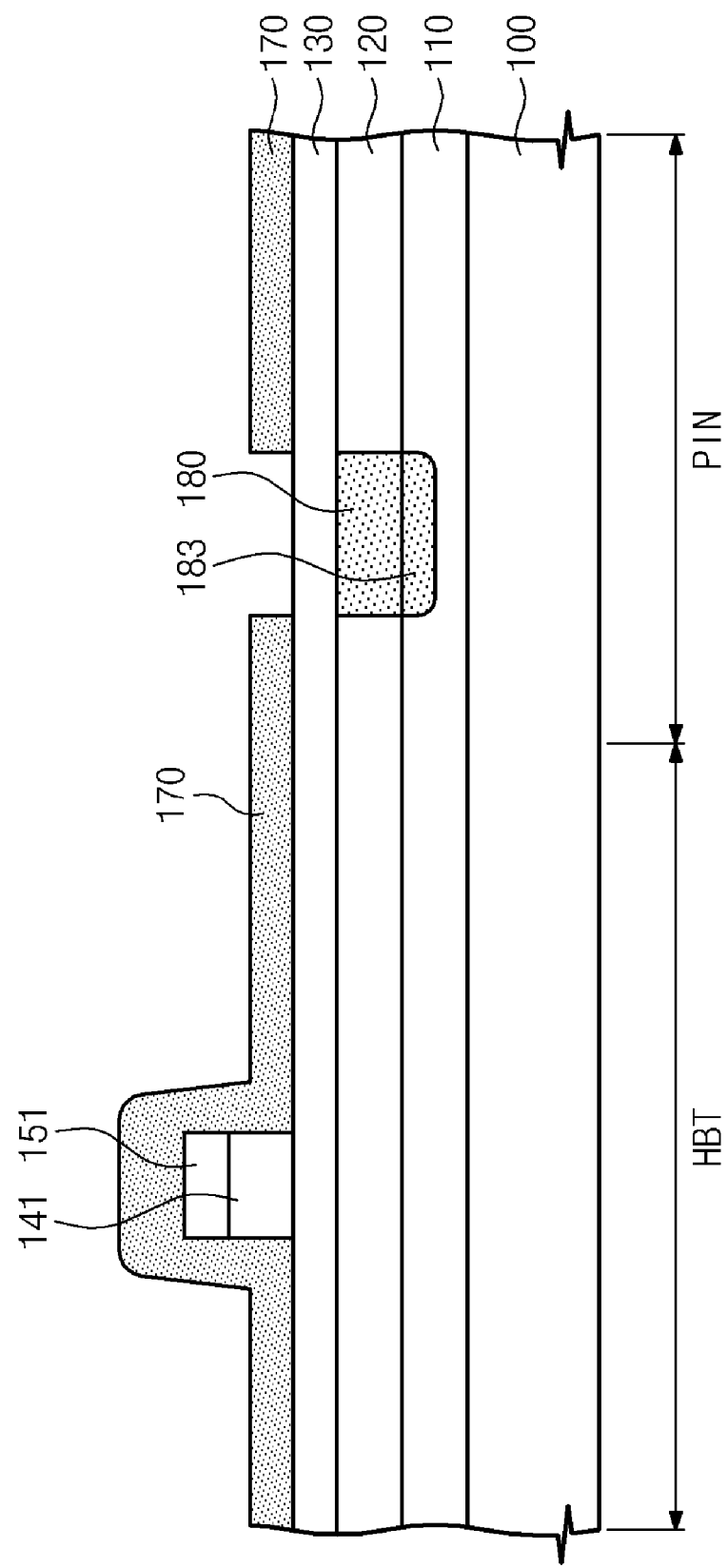
Figure 15:
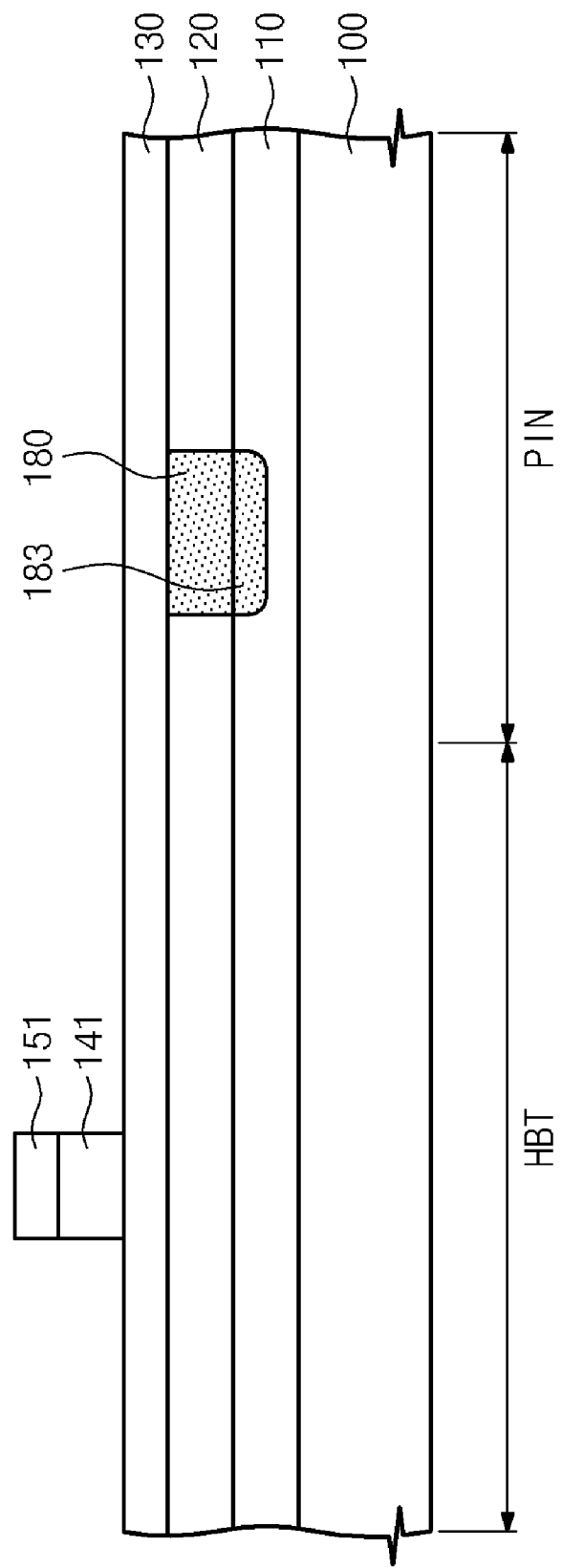

Referring to FIGS. 10 and 14, a first type impurity may be doped on at least a portion of the collector layer 120 and the sub-collector layer 110 of the PIN diode region in operation S3. An intrinsic region 180 is formed in the collector layer 110 by the doping process. The intrinsic region 180 may be formed by an ion implantation process using the mask pattern 170 as a mask. The ion implantation concentration may have the same level as the second type impurity concentration of the second type collector layer 120. The second type collector layer 120 may have an intrinsic characteristic due to the doping process. An additional doping region 183 is formed by doping at least a portion of the sub-collector layer 110 with a first type impurity. A depletion region may expand by the forming of the additional doping region 183. The doping of the sub-collector layer 110 may be performed by using more impurity than the doping of the collector layer 120. The doping concentration of the first type impurity of the sub-collector layer 110 may have the same level as the second type impurity concentration of the sub-collector layer 110. After the doping process, annealing may be additionally performed. The annealing may be RTA. For one example, the annealing may be performed for tens of seconds below about 350° C. to about 400° C. Referring to FIG. 15, after the doping process is finished, the mask pattern 170 may be removed.

Figure 16:
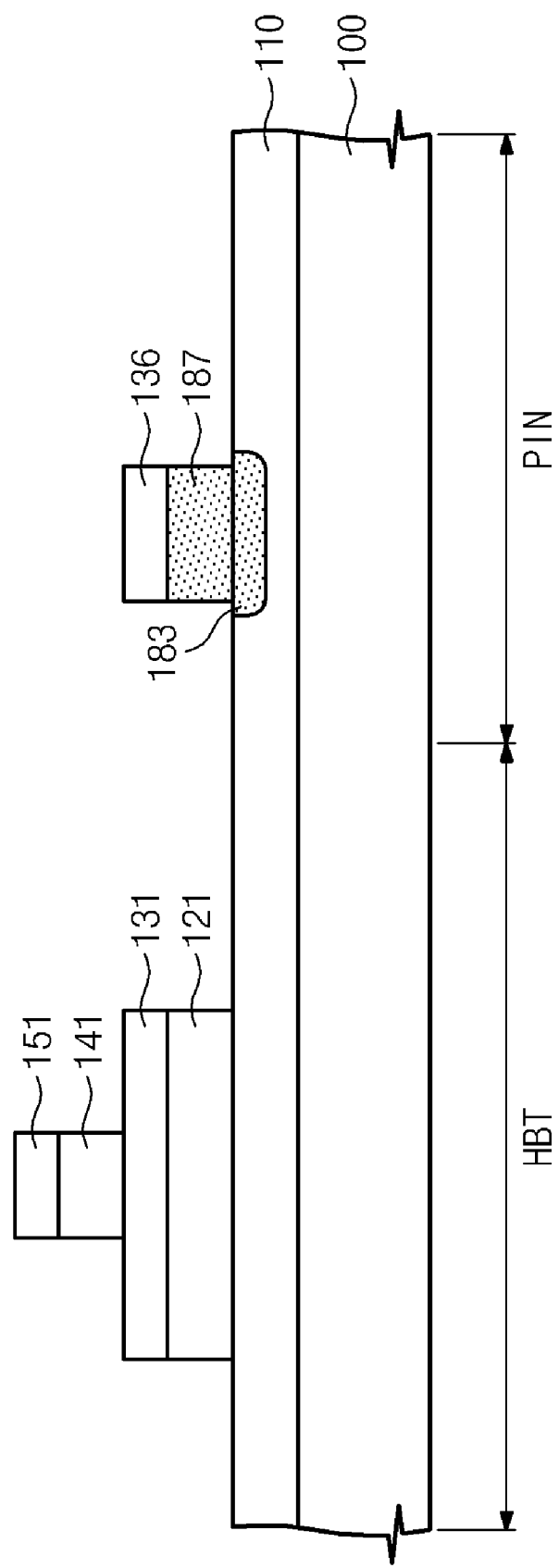

Referring to FIGS. 10 and 16, a base pattern 131, a collector pattern 121, the first type pattern 136, and the intrinsic pattern 187 may be formed using the second pattern process in operation S4. The second patterning process may be performed using the same method as the first patterning process. The intrinsic pattern 187 may include at least a portion of the intrinsic region 180.

Figure 17:
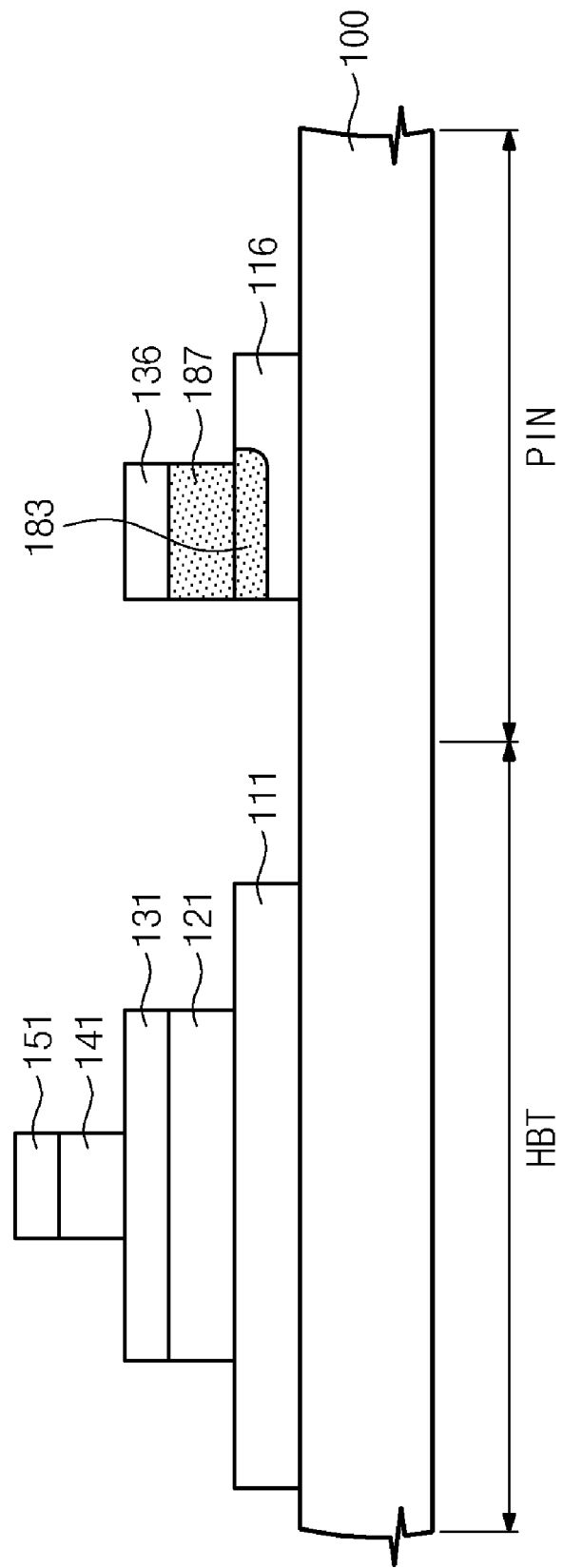

Referring to FIGS. 10 and 17, the sub-collector pattern 111 and the second type pattern 116 may be formed using a third patterning process in operation S5. The width of the second type pattern 116 may be formed being broader than the widths of the first type pattern 165 and the intrinsic pattern 187. At least a portion of an additional doping region 183 may be included in at least a portion of the second type pattern 116.

Figure 18:
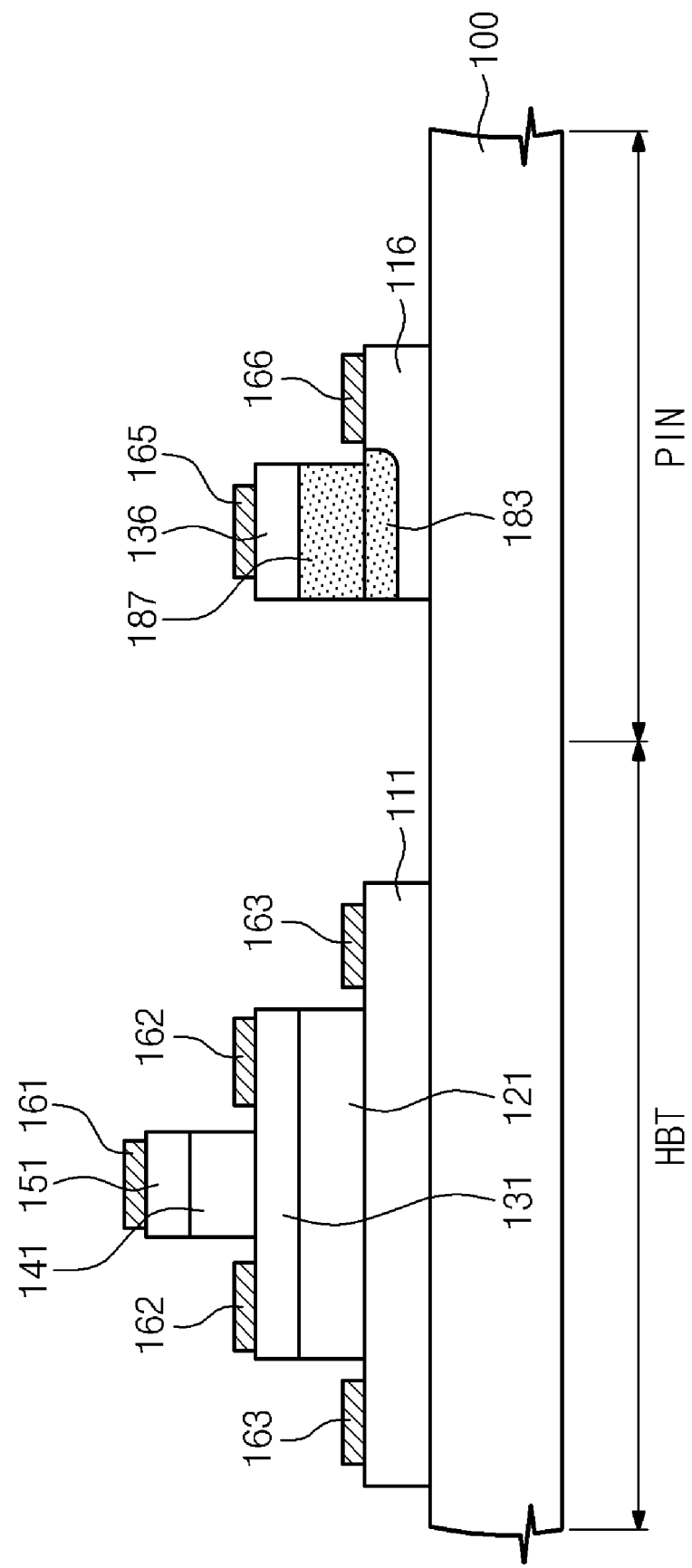

Referring to FIGS. 10 and 18, the HBT electrode and the PIN diode electrode may be formed in operation S6. The HBT electrode and the PIN diode electrode may be simultaneously formed using a lift off process. That is, a stencil pattern (not shown) is formed on the HBT and PIN diode to expose a portion where an electrode is formed, and then a metal layer (not shown) is deposited on the HBT and PIN diode. The metal layer on the stencil pattern may be removed together when the stencil pattern is melted. The HBT electrode may include an emitter electrode 161, a base electrode 162, and a collector electrode 163. The emitter electrode 161, the base electrode 162, and the collector electrode 163 may be formed on the emitter cap pattern 151, the base pattern 131, and the sub-collector pattern 111, respectively. The PIN diode electrode may include the electrode of the first type pattern 165 and the electrode of the second type pattern 166. The electrode of the first type pattern 165 and the electrode of the second type pattern 166 may be formed on the first type pattern 136 and the second type pattern 116, respectively. The electrodes 161 to 163 and 165 to 166 may include at least one of Ti, Pt, Au, Ni, and Ge.

The PIN diode may operate as a high frequency switch. Since the PIN diode is formed together with the HBT, processes can be simplified. The PIN diode may have an excellent characteristic at a high frequency region due to a high carrier mobility of the intrinsic pattern 187. In addition, a depletion region may be expanded by the additional doping region 183 such that electrical characteristics can be improved. Moreover, since the electrodes 161 to 163, 165, and 166 are simultaneously formed, processes can be simplified.

According to embodiments of the present invention, processes can be simplified by forming a HBT and a PIN diode simultaneously. An intrinsic region of the PIN diode is doped with a first type impurity different from a conductive type of a second type collector layer, such that the PIN diode with electrically improved reliability can be formed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a monolithic microwave integrated circuit device, the method comprising:
   forming a sub-collector layer, a collector layer, a base layer, an emitter layer, and an emitter cap layer on a Heterojunction Bipolar Transistor (HBT) region and a PIN diode region of a substrate;
   forming an emitter pattern and an emitter cap pattern in the HBT region and exposing the base layer by patterning the emitter layer and the emitter cap layer; and
   forming an intrinsic region by doping a portion of the collector layer of the PIN diode region with a first type impurity, the PIN diode region being spaced apart from the HBT region.

2. The method of claim 1, wherein the collector layer is a second type compound semiconductor.

3. The method of claim 2, wherein the doping of the PIN diode region with the first type impurity comprises:
   forming a mask pattern on the exposed base layer;
   implanting the first type impurity on the collector layer using the mask pattern as a mask; and
   removing the mask pattern.

4. The method of claim 3, wherein a maximum ion implantation region of the first type impurity is in the collector layer.

5. The method of claim 4, wherein a concentration of the ion implantation of the first type impurity has the same level as a second type impurity concentration of the collector layer.

6. The method of claim 2, further comprising:
   forming a base pattern and a collector pattern in the HBT region and forming a first type pattern and an intrinsic pattern in the PIN diode region, by patterning the base layer and the collector layer; and
   forming a sub-collector pattern in the HBT region and forming a second type pattern in the PIN diode region, by patterning the sub-collector layer.

7. The method of claim 2, wherein the first type is a p-type and the second type is an n-type.

8. The method of claim 2, wherein the first type impurity is Be or C.

9. The method of claim 3, further comprising: implanting a first type impurity on a portion of the sub-collector layer.

10. The method of claim 9, wherein a concentration of the first type impurity implanted on the sub-collector layer has the same level as a second type impurity concentration of the sub-collector layer.

11. The method of claim 6, wherein the second type pattern of the PIN diode region is formed being broader than widths of the first type pattern and the intrinsic pattern.

12. The method of claim 6, further comprising: forming electrodes of the HBT and the PIN diode.

13. The method of claim 12, wherein the forming of the electrodes comprises forming a base electrode and an electrode of the first type pattern simultaneously on the base layer.

14. The method of claim 12, wherein the forming of the electrodes comprises forming a collector electrode and an electrode of a second type pattern simultaneously on the sub-collector layer.

15. The method of claim 12, wherein the forming of the electrodes comprises forming an emitter electrode, a base electrode, a collector electrode, an electrode of a first type pattern, and an electrode of a second type pattern simultaneously.

16. The method of claim 12, wherein the forming of the electrodes is performed using a lift off process.

* * * * *